United States Patent
Das

(10) Patent No.: US 8,954,392 B2
(45) Date of Patent: Feb. 10, 2015

(54) EFFICIENT DE-DUPING USING DEEP PACKET INSPECTION

(71) Applicant: FutureWei Technologies, Inc., Plano, TX (US)

(72) Inventor: Kalyan Das, San Jose, CA (US)

(73) Assignee: FutureWei Technologies, Inc., Plano, TX (US)

( * ) Notice: Subject to any disclaimer, the term of this patent is extended or adjusted under 35 U.S.C. 154(b) by 89 days.

(21) Appl. No.: 13/730,232

(22) Filed: Dec. 28, 2012

(65) Prior Publication Data

US 2014/0188822 A1 Jul. 3, 2014

(51) Int. Cl.
*G06F 7/00* (2006.01)
*H03M 7/30* (2006.01)

(52) U.S. Cl.
CPC .............. *H03M 7/30* (2013.01); *H03M 7/3091* (2013.01)
USPC ........................................................ 707/644

(58) Field of Classification Search
USPC ........................................................ 707/644
See application file for complete search history.

(56) References Cited

U.S. PATENT DOCUMENTS

| 2010/0250896 A1 | 9/2010 | Matze |
| 2011/0016095 A1 | 1/2011 | Anglin et al. |
| 2012/0030477 A1* | 2/2012 | Lu et al. ................. 713/189 |

FOREIGN PATENT DOCUMENTS

WO 2012092212 A2 7/2012

OTHER PUBLICATIONS

International Search Report and Written Opinion received in International Application No. PCT/CN2013/090792, mailed Mar. 13, 2014, 12 pages.

* cited by examiner

*Primary Examiner* — Truong Vo
(74) *Attorney, Agent, or Firm* — Slater & Matsil, L.L.P.

(57) ABSTRACT

The efficiency of data de-duplication may be improved by storing related file data in a single container, or in multiple linked containers, of a history. Additionally, the efficiency of data de-duplication may be improved when shorter hash tables are used to reference historical data in a history. Shorter hash tables may be achieved by storing fewer than all the hash values obtained for a given amount of historical data. Further, the efficiency of data de-duplication may be improved by comparing related incoming file data with historical data from a container without hashing/chunking the remaining file data upon matching an earlier chunk of the incoming file data to the container.

23 Claims, 12 Drawing Sheets

NEW DATA SEGMENT WIRE FORMAT:

DATA REF WIRE FORMAT:

EFFICIENT DE-DUPING USING DEEP PACKET INSPECTION

TECHNICAL FIELD

The present invention relates generally to communications, and in particular embodiments, to efficient de-duplication using deep packet inspection.

BACKGROUND

Data de-duplication is a data compression technique for eliminating duplicate or repeating data from a data stream, and can be applied to network data transfers to reduce the number of bytes that must be sent. In the de-duplication process, unique chunks of data are identified and stored as historical data on both the transmit and receive sides of the network. Thereafter, incoming data is compared with the historical data on the transmit-side of the network, and when a redundant chunk is found, the redundant chunk is replaced with a reference indicator that points to the matching historical data. The receiver then uses the reference indicator to identify the matched historical data stored on the receiver side, which is used to replicate the duplicate data. Since the reference indicator is much smaller than the redundant chunk of data, and the same byte pattern may occur dozens, hundreds, or even thousands of times, the amount of data that must be stored or transferred can be greatly reduced.

The efficiency of a data de-duplication depends on a number of factors, including the algorithm used to store/match incoming data chunks with historical data. Conventional de-duplication techniques use a generic algorithm for all protocols, and hence the algorithm parameters are not tailored for specific protocols. Other factors include the length of the hash table, the length of the history, the size of the blocks used for generating hash values, etc. For instance, shorter hash tables generally allow for quicker searching, while longer histories typically allow for more frequent matching (since more historical data is available for de-duplication). Additionally, larger blocks provide for higher compression ratios (as larger for each matched blocks. However, smaller blocks provide for an increased likelihood that a match will be found. Other factors affecting the efficiency of data de-duplication include the amount of historical data stored in history, the method used for storing historical data, and the mechanism used to discard some of the old data to make room for newer data. New techniques and mechanisms for improving the efficiency of data de-duplication are desired.

SUMMARY OF THE INVENTION

Technical advantages are generally achieved, by embodiments of this disclosure which describe efficient de-duplication using deep packet inspection.

In accordance with an embodiment, a method for performing data de-duplication using deep packet inspection is provided. In this example, the method includes receiving file data carried by a data stream, partitioning a portion of file data into a data chunk, applying a hash algorithm to blocks within the data chunk to produce hash values. The method further includes selecting fewer than all of the hash values to store in a hash table, storing the portion of file data in a container in a history, and storing the selected hash values in an entry of the hash table without storing non-selected hash values in the hash table. An apparatus for performing this method is also provided.

In accordance with another embodiment, another method for performing data de-duplication using deep packet inspection is provided. In this example, the method includes receiving file data carried by a data stream, where the file data is associated with a common protocol. The method further includes partitioning the file data into a plurality of data chunks, identifying blocks of non-duplicate data within the data chunks, and storing all blocks of non-duplicate data into a single container such that all non-duplicate data within the data stream is concentrated in the single container. In alternative embodiments, the blocks of non-duplicate data may be stored into multiple linked containers such that all non-duplicate data within the data stream is concentrated in the multiple linked containers. An apparatus for performing this method is also provided.

In accordance with yet another embodiment, another method for performing data de-duplication using deep packet inspection is provided. In this example, the method includes receiving file data associated with a common protocol, partitioning a portion of the file data into a data chunk, applying a hash algorithm to blocks within the data chunk to produce hash values, and matching at least some of the hash values to an entry in a hash table. The entry includes a pointer indicating a container in a history. The method further includes reading all historical data from the container from the history, determining that the data chunk matches a segment of historical data from the container, and comparing remaining portions of the file data with remaining segments of historical data from the container. An apparatus for performing this method is also provided.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise

DETAILED DESCRIPTION OF ILLUSTRATIVE EMBODIMENTS

Figure 1:
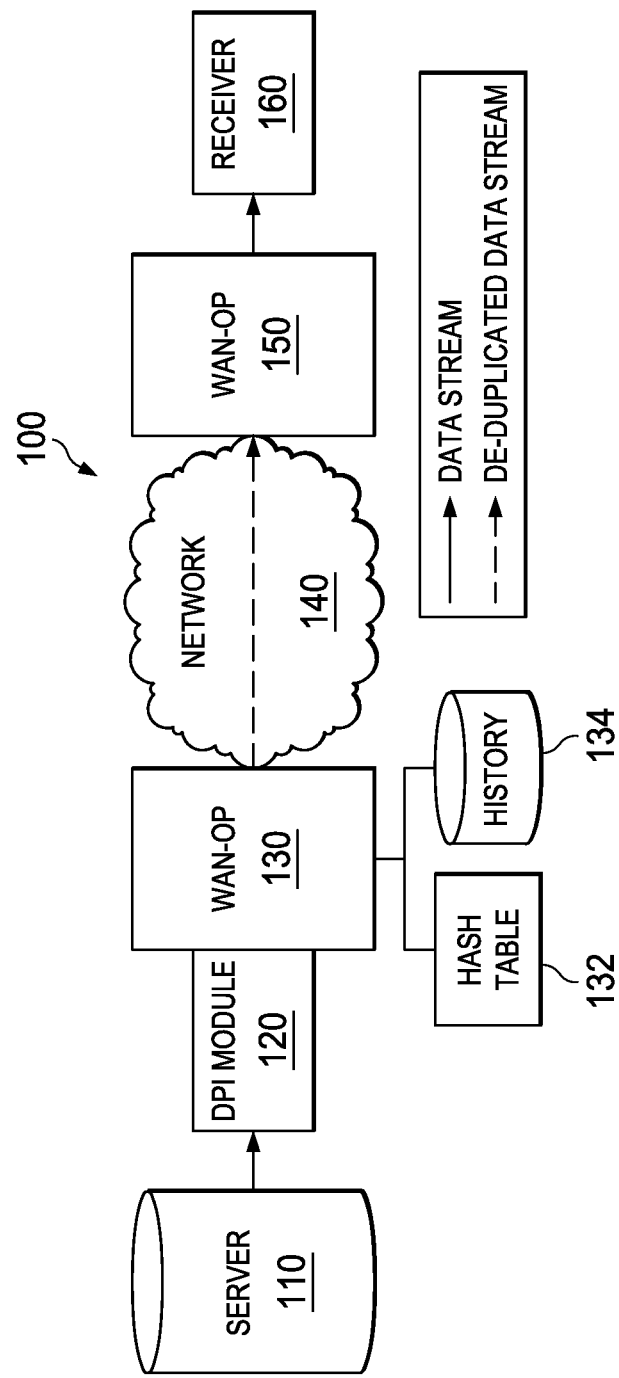
FIG. 1 illustrates an embodiment communications network.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Aspects of this disclosure provide techniques for improving the efficiency of data de-duplication. One aspect of this disclosure stores file data related to a common protocol in a single container (or in two or more linked containers), thereby allowing for more efficient de-duplication processing (as described in greater detail below). Another aspect of this disclosure provides shorter hash tables by storing fewer than all the hash values obtained for a given amount of historical data stored in history. Yet another aspect of this disclosure achieves more efficient de-duplication by comparing remaining portions of incoming file data (e.g., file data associated with the same object ID) with historical data from a container without hashing/chunking upon matching an earlier chunk of the incoming file data to historical data in the container.

Embodiments of this disclosure may be performed by a deep packet inspection (DPI) module and/or a de-duplication module. The DPI module may determine whether file data of an incoming data stream is associated with a known protocol. If so, the DPI module tags the file data with an object ID associated with the known protocol, and forwards the data stream to the de-duplication engine. The de-duplication engine may then separate file data related to the object ID into an object, and thereafter partition a first portion of the related file data into a first data chunk. The first data chunk is then divided into blocks, and hashed to produce a plurality of hash values. If one or more of the hash values match an entry in the hash table, then a corresponding container (as identified by the hash table entry) is read from the history, and the first data chunk is compared with the historical data of the container to determine if there is match. If some or all of the data chunk is matched to historical data in the container, then remaining portions of the incoming file data (e.g., file data associated with the common object ID) are compared with historical data in the container without chunking or hashing the incoming file data. Since the related historical data is stored in common containers, there is a relatively high probability that the remaining portions of the incoming file data will be successfully matched to historical data in the container after the earlier matched data chunk is confirmed.

Aspects of this disclosure provide at least the following six benefits: (I) Aspects of this disclosure reduce the hash table size by storing fewer than all of the hash values for a new data chunk. A smaller hash table allows for more efficient searching of the hash table, as well as allows for a given hash table to support a longer history. (II) Aspects of this disclosure allow for an entire object can to be recreated at the receiver-side of the network, thereby achieving a higher compression ratio; (III) Aspects of this disclosure allow for larger amounts of data (e.g., entire data chunks, or even objects) to be matched using fewer hash entries. (IV) Aspects of this disclosure reduce processing related to the chunking and hashing of incoming file data by comparing related file data directly to a container (e.g., without chunking or hashing the file data) upon matching a preceding chunk of the file data to historical data in the container; (V), Aspects of this disclosure reduce disk input/output delays by preloading linked containers when performing data de-duplication. For instance, a second linked container may be pre-loaded into memory while the first linked container is being compared to incoming file data. The container may be linked if the first linked container is filled before all related file data can be stored during an earlier storage operation; (VI) Aspects of this disclosure allow for more efficient removal of old/unused historical data from the history, as related file data is stored in a single container (or a chain of linked containers), which can be discarded in fewer read/delete operations.

Aspects of this disclosure may be performed by a deep packet inspection (DPI) module, which may be coupled to the data de-duplication engine on the transmit side of the network. FIG. 1 illustrates an embodiment network 100 for communicating data from a server 110 to a receiver 160. As shown, the network 100 comprises the server 110, a deep-packet inspection (DPI) module 120, a transmit side de-duplication module 130, an intermediary network 140, a receive side de-duplication module 150, and a receiver 160. The server 110 may send a data stream to the receiver 160. The DPI module 120 and the de-duplication (de-dup) modules 130, 150 may perform data de-duplication to reduce the load on the intermediary network 140. The de-duplication module 130 may have access to a hash table 132 and a history 134. In some embodiments, the hash table 132 and/or the history 134 may be local storage on the de-duplication module 130. In other embodiments, the hash table 132 and/or may be external storage that is accessible by the de-duplication module 130. Likewise, the de-duplication module 150 may include an internal or external history 154. The de-duplication modules 130, 150 may be any components configured to perform data de-duplication, such as wide area network (WAN) operating device (ODs), etc.

The DPI module 120 may inspect data carried in payloads of transport control protocol (TCP) packets. In some embodiments, the DPI module 120 may determine a type of protocol that is being used in the TCP session, such as a file transport protocol (FTP), system message block (SMB), network file system (NFS), and others. Thereafter, the DPI module 120 locates the start of an object within the TCP packet payloads. Locating the start of an object may be protocol dependent. For instance, if the TCP session is using FTP, the DPI module 120 may identify a start of file-contents when locating the start of the object. Alternatively, if the TCP session is using SMB, then the DPI module 120 may locate the start of the object in accordance with a file OPEN request/response. In any event, the DPI module 120 will group related file data in consecutive payloads, and associate that related file data with a common object ID. The object ID may be appended (or otherwise associated with) the related file data when the file data is forwarded to the de-duplication module 130.

The de-duplication module 130 may select a de-duplication algorithm for processing the file data based on the object ID. The de-duplication algorithm may specify various de-duplication parameters, including chunk size, block size, the number of hash values to store in the hash table (e.g., in the event that portions of the file data are not matched to historical data during de-duplication), conditions/mechanisms for removing old or seldom duplicated historical data, and others. After selecting the de-duplication algorithm, the de-duplication module 130 may separate a first portion of the file data into a first data chunk, divide the first data chunk into one or more blocks, and then apply a hash algorithm to the blocks to produce a plurality of hash values (e.g., a hash value for each block). The hash values will then be compared to entries in the hash table 132 to determine whether the object is a candidate for de-duplication.

If one or more of the hash values match a corresponding entry in the hash table 132, then a corresponding reference pointer and offset indicators of the matched entry will be used to identify a segment of historical data in the history 134. More specially, the reference pointer may be used to identify a container in the history 134 that stores, inter alia, the segment of historical data corresponding to the matched entry. Thereafter, the entire container will be read, and corresponding portions of the segment of historical data (as identified by the offset indicators) will be aligned to corresponding blocks of the first data chunk (e.g., the block producing the matched hash values) so that the first data chunk and the segment of historical data (e.g., corresponding to the matched entry) may be compared bit-by-bit.

If the chunks match, a reference indicator will be transmitted in liu of the file data. In some embodiments, remaining portions of the related file data (e.g., file data that was not included in the first data chunk) may be compared with historical data in the container without chunking or hashing. To wit, remaining file data that is associated with the same object ID as the first data chunk may be compared to the historical data (which has already been read into memory). This avoids wasting processing resources to chunk and hash the remaining file data, which is relatively likely to match historical data of the container (given that related historical data is stored in the same container or linked containers). In some embodiments, the container associated with the matched hash table entry may be linked to one or more other containers, as might be the case when related historical file data was too voluminous to fit in a single container during the earlier storage procedure. In such cases, the other linked container may be pre-loaded into memory when the remaining file data is being compared to historical data in the container associated with the matched hash table entry. A hash table entry may include various information, such as a hash value, a container number, one or more offset indicators, the size of the block, etc.

If hash values are not found in the hash table 132, then the first data chunk may be stored in the history 134, and a corresponding entry may be made in the hash table 132. More specifically, fewer than all of the hash values produced for the data chunk are selected for storing in the hash table 132. The remaining data chunks (e.g., subsequent data chunks associated with the same object or protocol as the first data chunk) may be processed. If those chunks are not de-duplicated, then they may be stored in the same container as the first data chunk. When space or circumstances do not allow all the related chunks to be stored in a common container, the related chunks may be stored in different containers that are linked (or otherwise associated with) one another, e.g., in the hash table 132 or otherwise.

Figure 2:
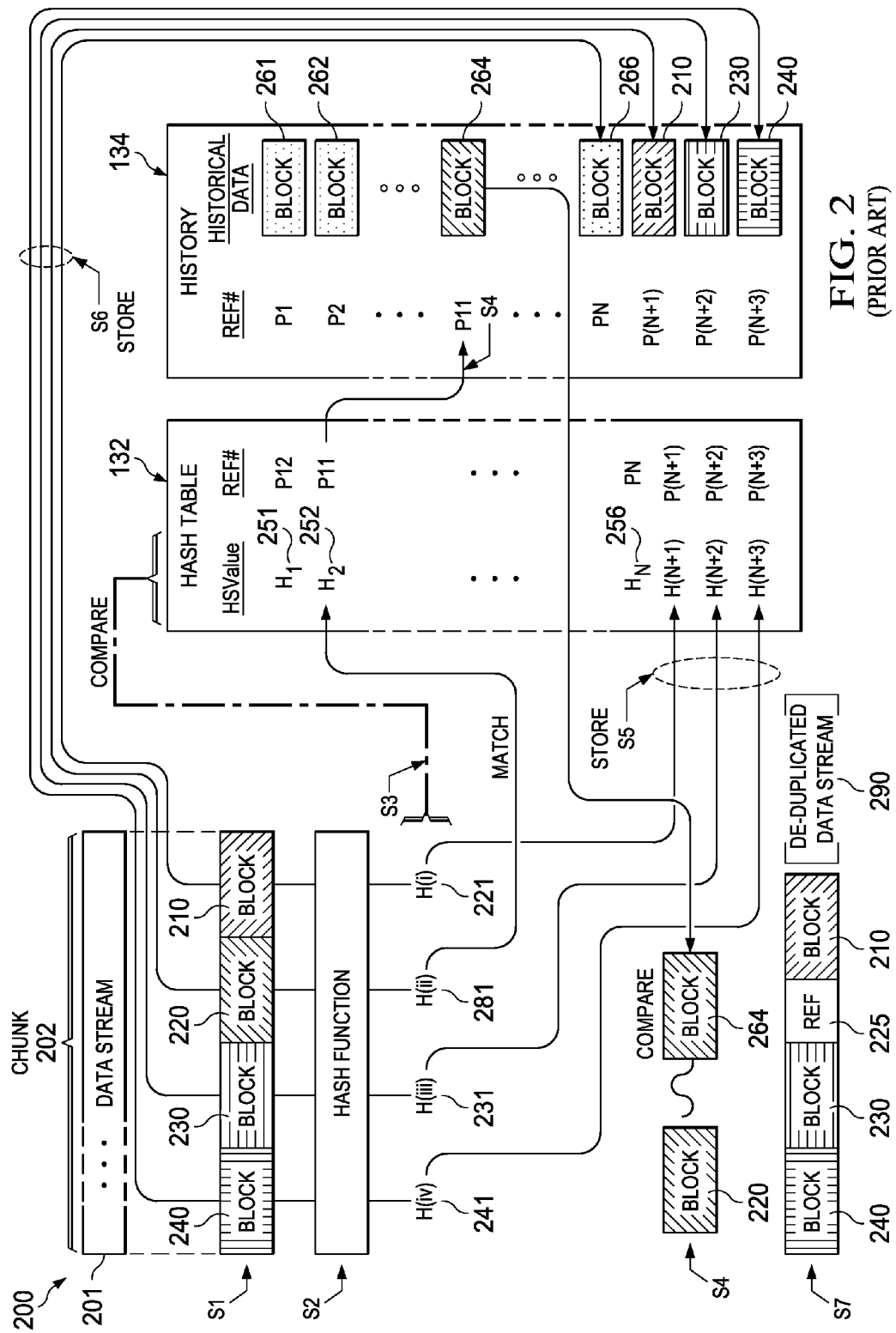
FIG. 2 illustrates a conventional de-duplication and storing procedure.

Conventional data de-duplication networks may lack the DPI module 120, and instead rely solely on the de-duplication modules 130, 150 to perform data de-duplication. FIG. 2 shows a diagram of a conventional de-duplication procedure 200 to covert an uncompressed data stream 201 into a de-duplicated data stream 290, as might be performed by the de-duplication module 130 without the aid of the DPI module 120. As shown, the data stream 201 includes a chunk 202 of data that is broken into a plurality of blocks 210-240 during a first step (S1). Thereafter, a hash algorithm is applied to the blocks 210-240 to obtain a plurality of hash values H(i), H(ii), H(iii), and H(iv) during a second step (S2). Next, the hash values H(i), H(ii), H(iii), and H(iv) are compared with a hash table 250 during a third step (S3). In this example, the hash value H(ii) matches the hash table entry $H_2$, which indicates that the block 220 may be a candidate for data de-duplication. Accordingly, the de-duplication module 130 locates a corresponding block 264 in the history 134 (in accordance with a reference pointer (P11)). and compares the block 220 with the block 266 during a fourth step (S4). In this example, it is determined that the block 220 matches the block 266. Additionally, the blocks 210, 230, and 240 are treated as new data because the hash values H(i), H(iii), and H(iv) where not found in the hash table, and consequently new entries corresponding to the hash values H(i), H(iii), and H(iv) are made in hash table 132 during a fifth step (S5) and the and the blocks 210, 230, and 240 are stored in the history 134 during a sixth step (S6). Finally, the block 220 is replaced by a reference indicator (Ref) 225 to form the de-duplicated data stream 290 during a seventh step (S7), prior to transmitting the de-duplicated data stream 290 over the network. The reference indicator 225 may be any indicator that allows the de-duplication module 150 to locate the duplicated data block 220 in the history 225.

Efficiency of the conventional data de-duplication procedure 200 is limited by the size of the blocks 210-240, the size of the hash table 132, and the length of the history 134. To wit, the probability of finding a match is increased when the blocks 210-240 are shorter and/or when the history 134 is longer. However, when the blocks 210-240 are short, the hash table 132 becomes longer, as more hash values are generated for same length history 134. Aspects of this disclosure store fewer than all of the hash values derived from a given chunk/object in the hash table, thereby allowing a smaller hash table to represent a longer history.

Figure 3:
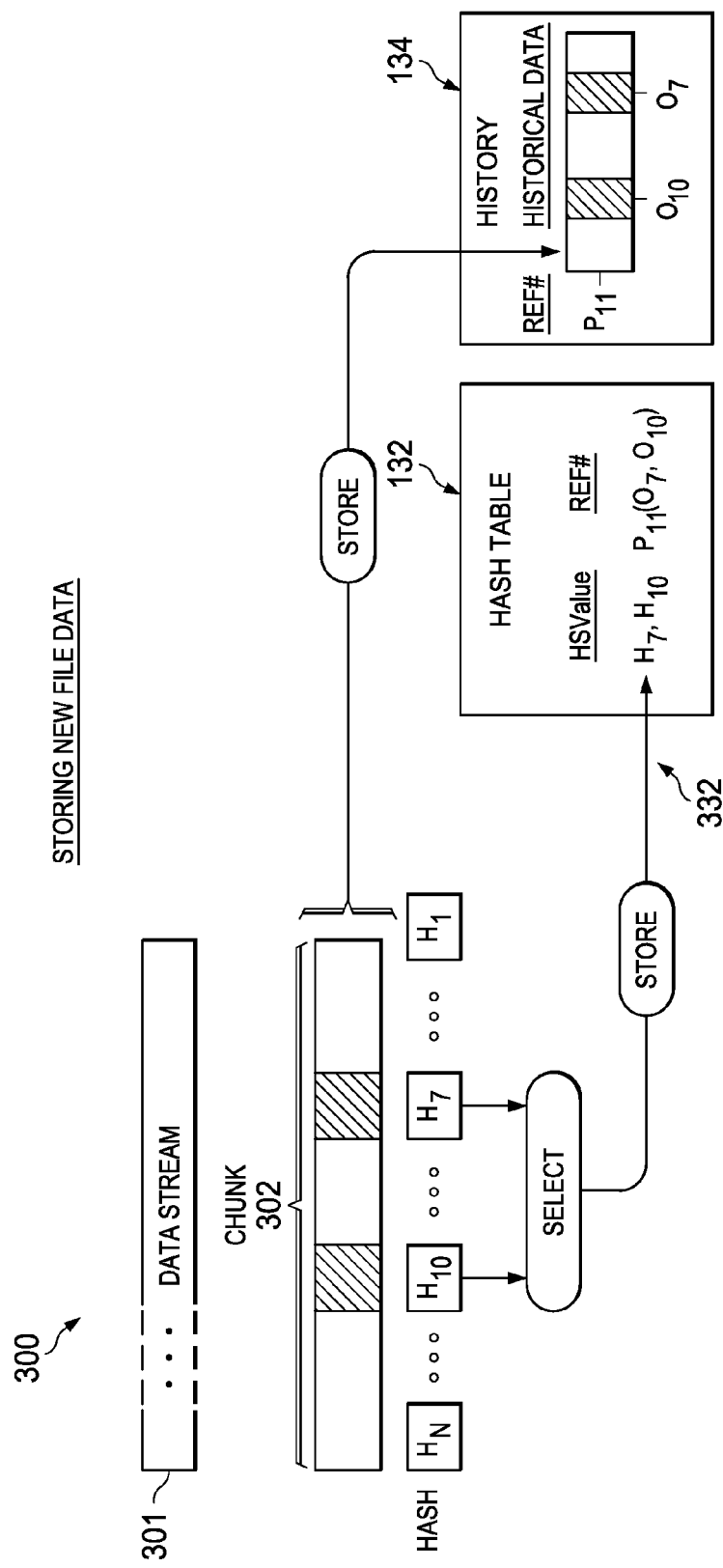
FIG. 3 illustrates an embodiment storing procedure for inputting new file data into history/hash tables.

FIG. 3 illustrates a storing procedure 300 for inputting new file data into history/hash tables 132-134 in accordance with aspects of this disclosure. As shown, a portion of a data stream 301 is placed into a first chunk 302, for which a hash function is applied to obtain a plurality of hash values ($H_1, H_2, \ldots H_N$). Thereafter, the hash values ($H_1, H_2, \ldots H_N$) are compared with entries in the hash table 132, where it is determined that the hash values ($H_1, H_2, \ldots H_N$) do not match any of the entries in the hash table 132. Thereafter, the data chunk 302 is stored into the history 134, and a corresponding entry is made in the hash table 132. In doing so, fewer than all of the hash values ($H_1, H_2, \ldots H_N$) are selected for storing in the hash table 132. In this example, two hash values ($H_7$ and $H_{10}$) are selected for storing in the hash table 132. However, fewer or more hash values may be selected for each new data chunk. Thereafter, the chunk 302 is stored in the history 134, and an entry 332 is made for the selected hash values ($H_7$ and $H_{10}$) in the hash table 132. Notably, a reference pointer $P_{11}$ is included in the entry 332, which indicates a location of the data chunk 302 in the history 134. In embodiments, the entry 332 may further include offset indicators ($O_7, O_{10}$) to indicate the locations of blocks producing the selected hash values within the segment of historical data.

Figure 4:
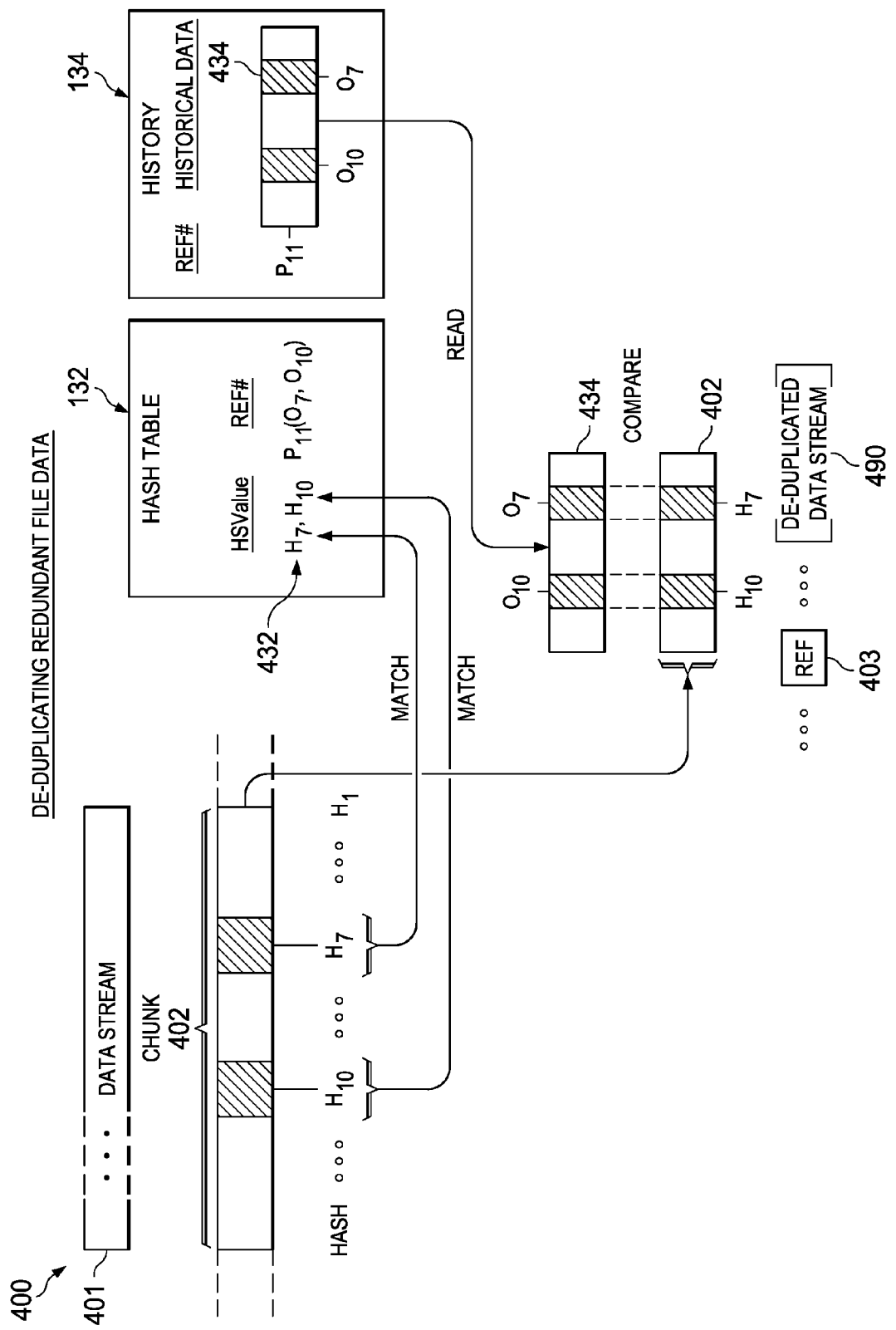
FIG. 4 illustrates an embodiment de-duplication procedure.

FIG. 4 illustrates a de-duplication procedure 400 for de-duplicating file data of a data stream 401 in accordance with aspects of this disclosure. As shown, a portion of the data stream 401 is placed into a first chunk 402, for which a hash function is applied to obtain a plurality of hash values ($H_1, H_2, \ldots H_N$). Thereafter, the hash values are compared with entries in the hash table 132. For the de-duplicating procedure 400, it is determined that the hash values $H_7$ and $H_{10}$ match the entry 432 in the hash table 132. Accordingly, the reference point $P_{11}(O_7, O_{10})$ of the entry 432 is used to locate the chunk 434 in the history 134. In some embodiments, the reference point $P_{11}(O_7, O_{10})$ may indicate a container ($P_{11}$) in storing the chunk 434, as well as one or more offsets, e.g., $O_7$ and $O_{10}$, specifying the locations of blocks corresponding to the selected hash values $H_7$ and $H_{10}$. Next, the chunk 434 is read from the history 134, and compared with the chunk 402 in the data stream 401. More specifically, the chunks 402 and 434 are lined up in accordance with the corresponding offsets $O_7$ and $O_{10}$ as shown in FIG. 4, and are thereafter compared bit-by-bit to ensure that they match. Upon confirming that the chunks 402 and 434 match, the chunk 402 is replaced by a reference indicator 403 in the de-duplicated data stream 490, which is subsequently transmitted over the network.

Figure 5:
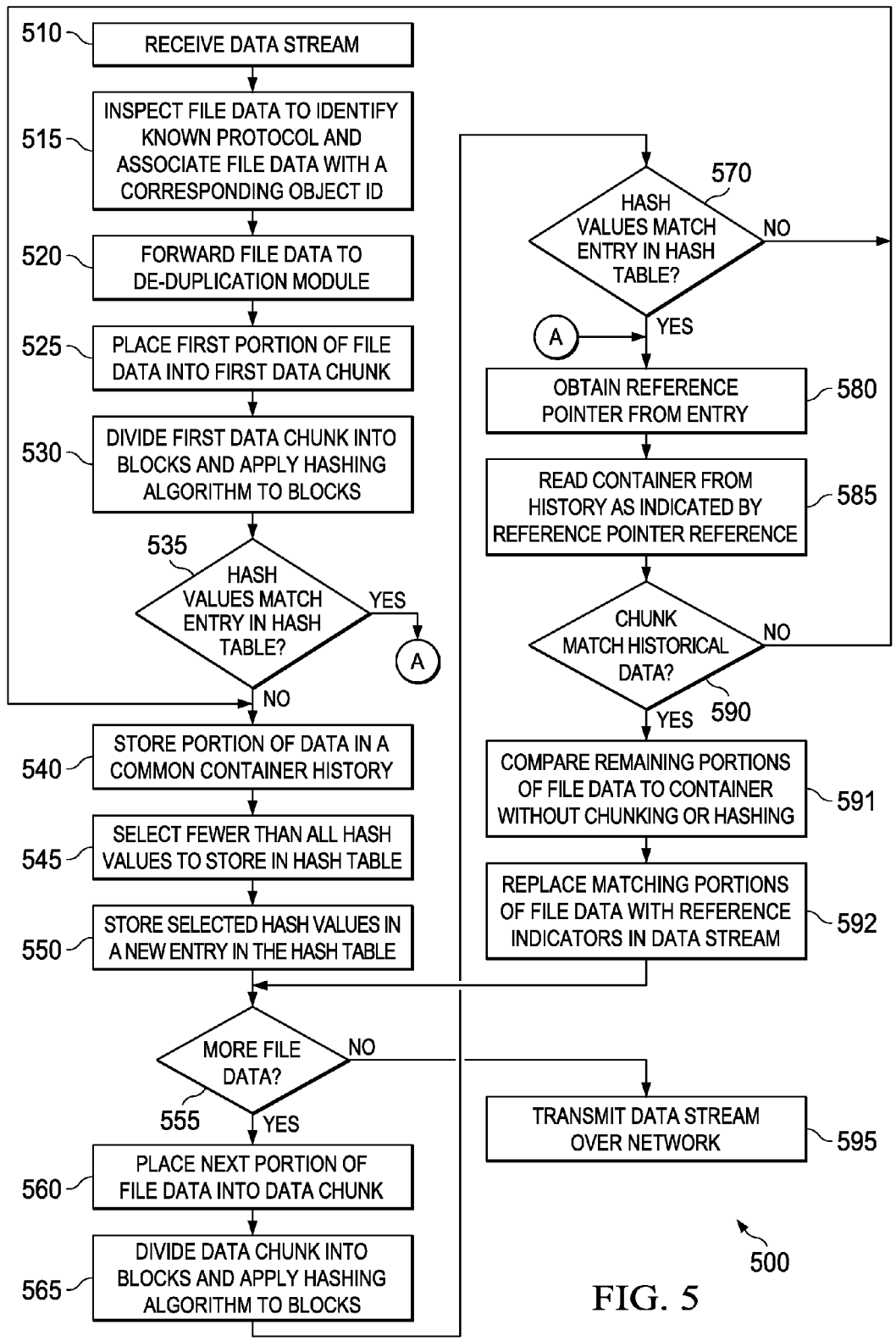
FIG. 5 illustrates a flowchart of a method for de-duplicating data.

FIG. 5 illustrates a method 500 for de-duplicating data in accordance with aspects of this disclosure, as may be performed by a transmit-side de-duplication module and DPI module. The method 500 begins at step 510, where the DPI module receives a data stream. Next, the method 500 proceeds to step 515, where the DPI module inspects file data within the data stream to determine whether the file data is associated with a known protocol, and then tags (or otherwise associates) the file data with an object ID. If the file data is not associated with a known protocol, then a generic object ID may be used. If the file data is associated with a known protocol, then all file data associated with the known protocol may be associated with the same object ID, so that it is treated as related file data by the de-duplication module. Thereafter, the method 500 begins at step 520, where file data is forwarded to the de-duplication module. Next, the method 500 proceeds to step 525, where the de-duplication module places a first portion of the file data into a first data chunk. Subsequently, the method 500 proceeds to step 530, where the de-duplication module divides the first data chunk into blocks, and applies a hashing algorithm to the blocks to obtain a plurality of hash values. Thereafter, the method 500 proceeds to step 535, where the de-duplication module compares the hash values to entries in the hash table to determine whether the hash values match one of the entries. In some embodiments, the blocks are hashed and searched consecutively such that the hash table is searched prior to hashing the next block.

If the hash values do not match an entry in the hash table, then the method 500 proceeds to step 540, where the de-duplication module stores the data chunk in history. Thereafter, the method 500 proceeds to the step 545, where the de-duplication module selects fewer than all of the hash values obtained during step 530 to store in the hash table. The hash values may be selected in accordance with an algorithm, e.g., highest N hash values (N is an integer), etc. Next, the method 500 proceeds to the step 550, where the de-duplication module stores the selected hash values in a new entry in the hash table. Thereafter, the method 500 proceeds to the step 555, where de-duplication module determines whether more related file data needs to be processed (e.g., whether more file data exists in the object). If not, then the method 500 proceeds to the step 595, where the data stream is transmitted over the network. If there is more file data to be processed, the method 500 proceeds to the step 560, where the de-duplication module places the next portion of the file data into data chunk. Next, the method 500 proceeds to the step 565, where the de-duplication module divides the data chunk into blocks, and applies a hashing algorithm to the blocks to obtain a plurality of hash values. Thereafter, the method 500 proceeds to the step 565, where the de-duplication module compares the hash values to entries in the hash table to determine whether the hash values match one of the entries. If the hash values do not match an entry in the hash table, then the method 500 reverts back to step 540

If the hash values match an entry in the hash table, then the method 500 proceeds to step 580, where the de-duplication module obtains a reference pointer from the matching entry. Thereafter, the method 500 proceeds to the step 585, where the de-duplication module reads the container from history as indicated by the reference pointer. Next, the method 500 proceeds to the step 590, where the de-duplication module compares the data chunk with the historical data in the container to see if there is a match. If not, the method 500 proceeds to step 540. If the chunk matches historical data in the container, then the method 500 proceeds to step 591, where the de-duplication module compares remaining portions of the file data to historical data in the container without chunking or hashing the remaining portions of file data. Next, the method 500 proceeds to step 592, where the de-duplication module replaces matching portions of the file data with reference indicators in data stream. Thereafter, the method 500 proceeds to step 555.

Figure 6:
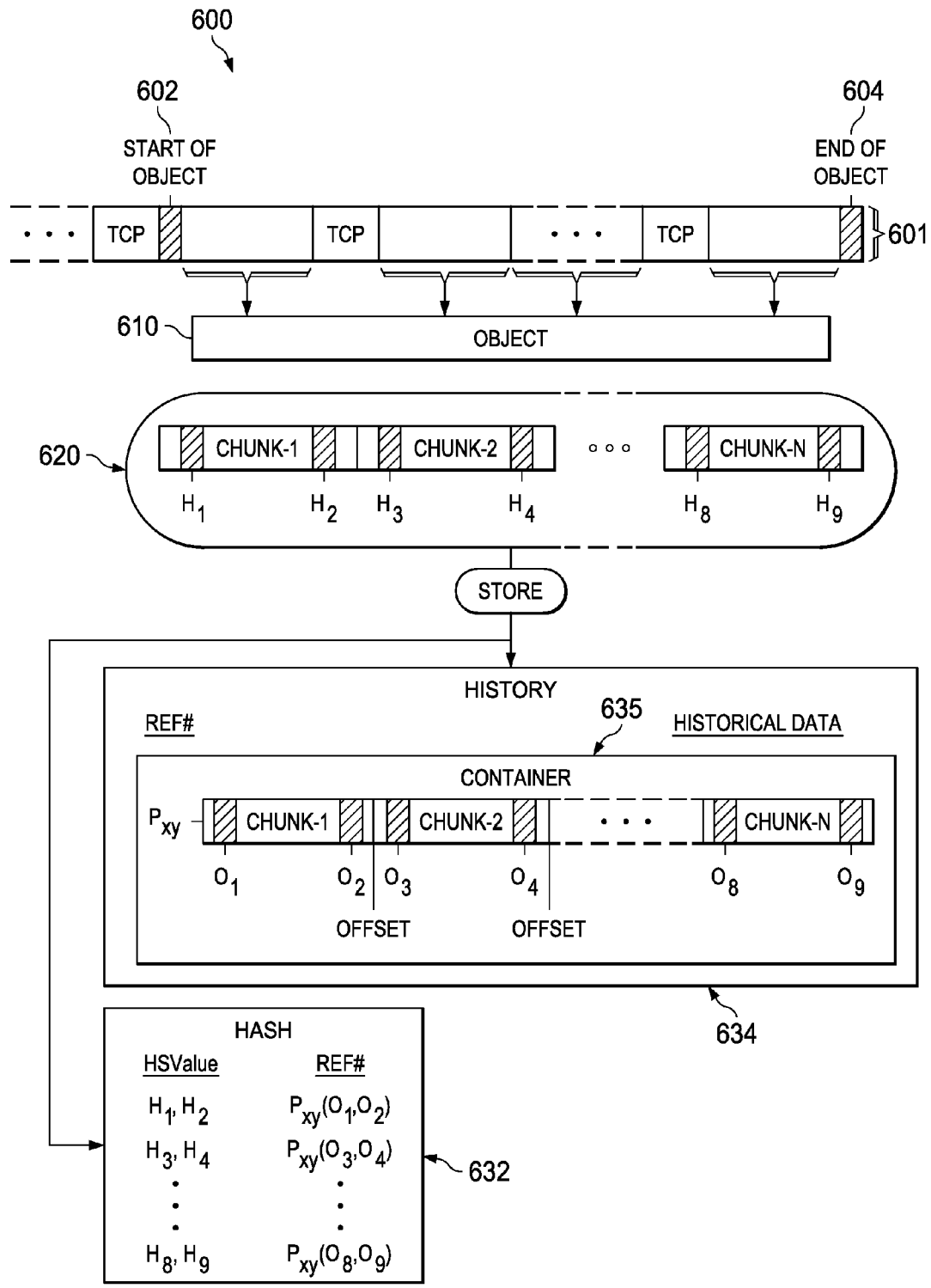
FIG. 6 illustrates an embodiment storing procedure for inputting new file data into history.

In some embodiments, portions of incoming file data from the same object may be stored in the same container in history. FIG. 6 illustrates a procedure 600 in which related file data is stored in the same container in history. As shown, an object 610 is located in a data stream 601 by identifying a start of object 602 and an end of object 604. The start of object 602 and end of object 604 may be headers corresponding to a known protocol, e.g., NFS headers, etc., and may be identified by a DPI module. The file data may be placed in the object 610 by stripping the TCP headers, as well as any file data headers (e.g., NFS headers indicating start/end of object) from the data stream, and placing the remaining contiguous payload data in the object 610. The object may thereafter be sub-divided into a plurality of chunks 620 (chunk-1, chunk-2 . . . chunk-n), which may be hashed to obtain a plurality of hash values. Fewer than all of the hash values associated with each of the segment of file data carried by the chunks 620 may be selected for storing in the hash table 632. Accordingly, the file data of the object 610 may be stored in a common container 635, which may be indexed by a reference number $P_{xy}$. An entry for each of the chunks 620 may be made in the hash table 632, with each entry including the reference pointer $P_{xy}$ and a set of offset values indicating the location of relevant blocks (e.g., the blocks producing the selected hash values $H_1, \ldots H_9$) within the container 635. Notably, portions of file data that are stored in history may be referred to as segments of historical data, rather than data chunks, as data chunks may generally reference portions of incoming file data.

Figure 7:
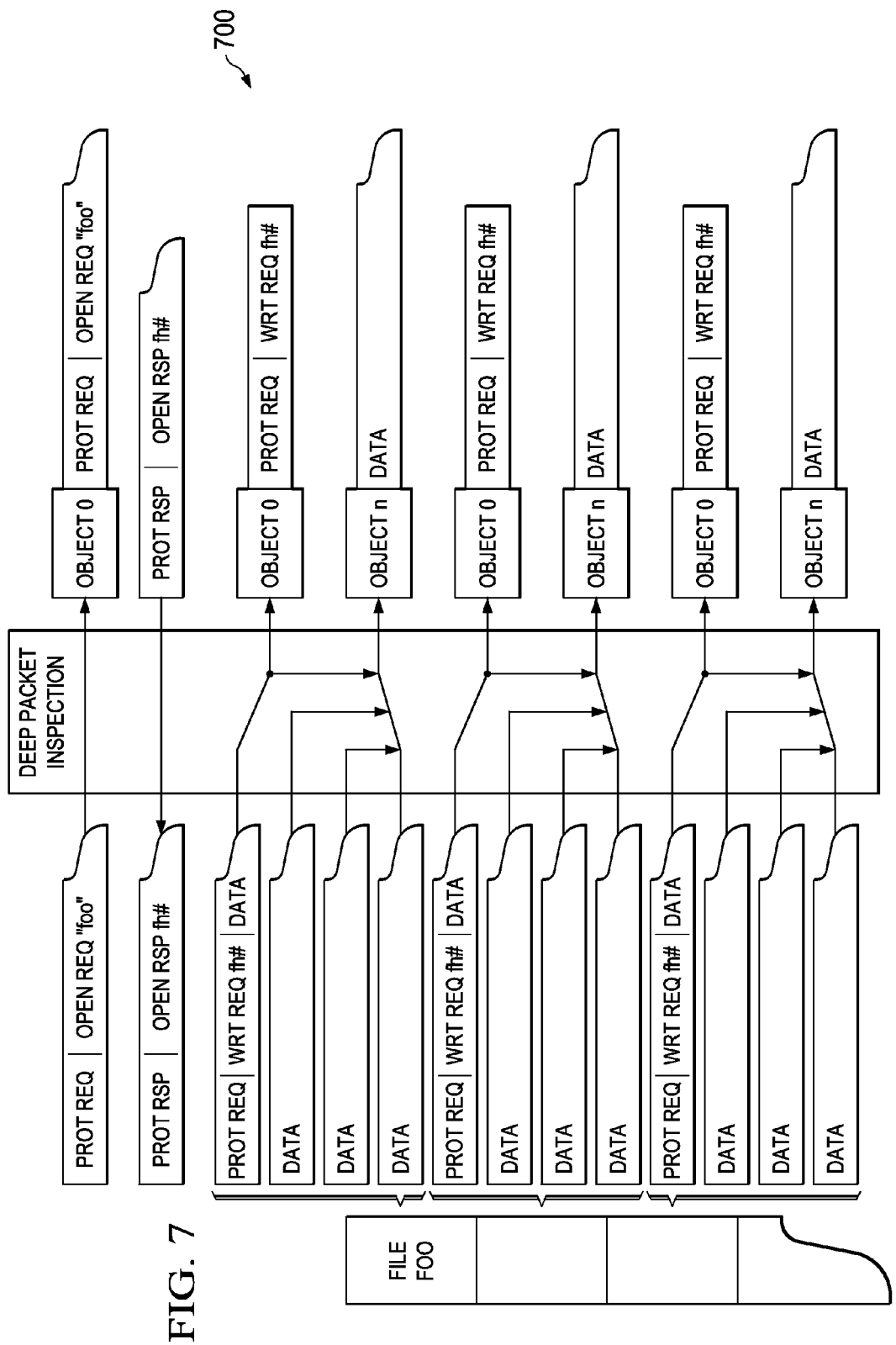
FIG. 7 illustrates an embodiment deep packet inspection module.

FIG. 7 illustrates a DPI module 700. As shown, the DPI module 700 first identifies a known protocol, and then proceeds to locate the start of an object (e.g., a file comprising file data). The DPI module 700 assigns a unique object ID to the object in accordance with an algorithm, which may assign the object ID in accordance with an object name, a server IP where the object is located, a path within the directory, a content of the first data segment of the file. The algorithm may ensure that the Object ID remains the same when the file is retransmitted. In some embodiments, it may not be necessary to use the same Object ID, as the overlapping of data may create a cross reference to other objects. However, using the same Object ID may provide an additional hint from which the de-duplication engine may benefit. The DPI module 700 also identifies stream contents that are not part of an object and tags such contents as non-object (a predefined value of zero for object ID). This includes all non-object related traffic such as session negotiation, directory mapping, file open, and the protocol specific header part of the actual data transfer.

In some embodiments, the DPI module 700 may perform additional processing (e.g., processing not explicitly shown in FIG. 7). For instance, the DPI module 700 may handle traffic associated with unknown protocols differently than traffic associated with known protocols. In an embodiment, the DPI module 700 may be unable to recognize an underlying protocol associated with a traffic stream, and may tag the contents with a generic object ID (e.g., 0xFFFF, FFFF, etc.). As a result, the de-duplication engine will use such contents to find matches in the history but will not link the chunks with the generic object ID together.

Figure 8:
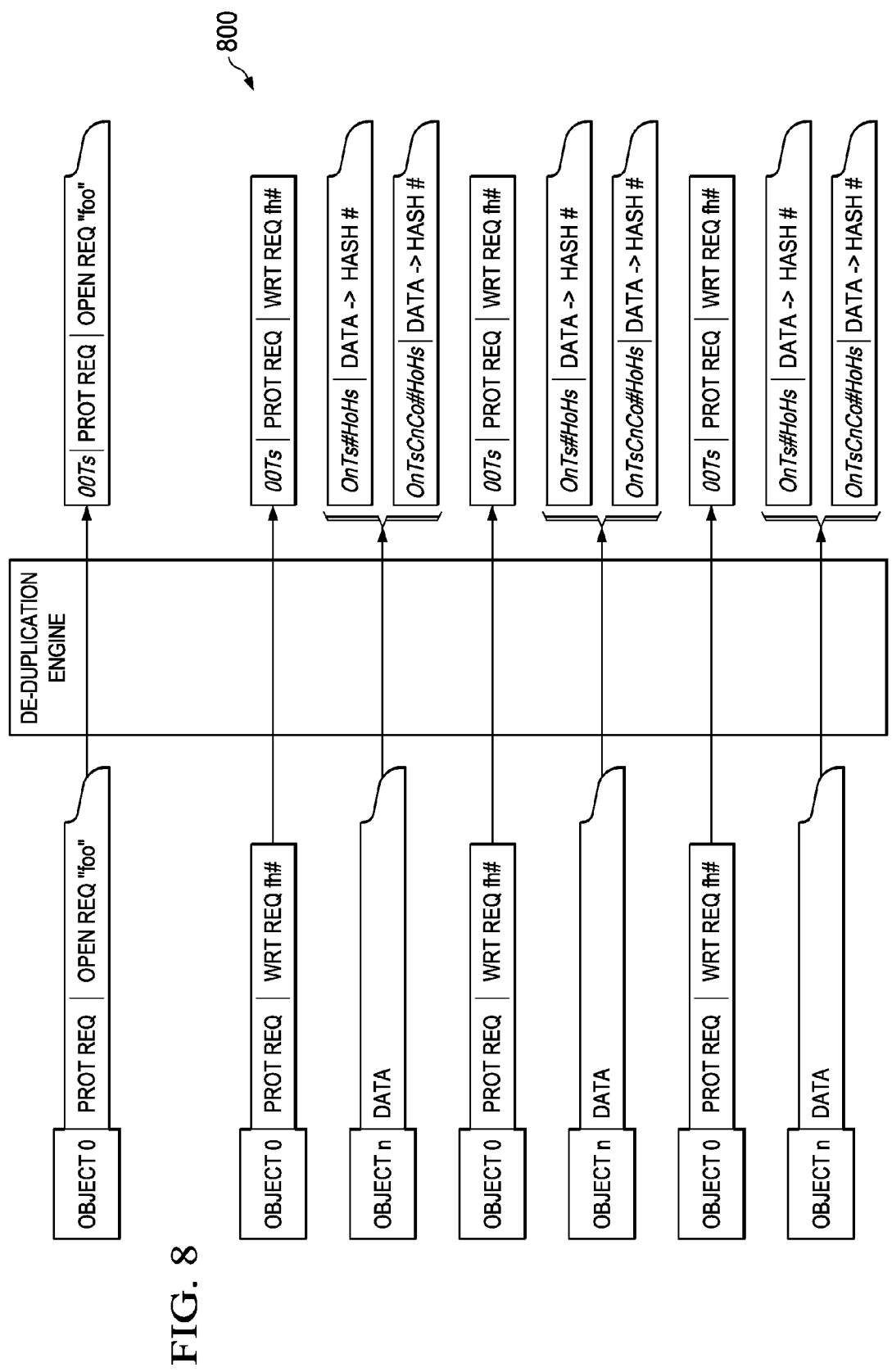
FIG. 8 illustrates an embodiment de-duplication module.

FIG. 8 illustrates a de-duplication engine 800, as may be coupled to the DPI module 700. As shown, incoming contents have been tagged with object information. As such, the de-duplication engine 800 processes contents according to their respective tags. Contents that are not part of any object may be forwarded without further processing, or may be run through a library based compression engine (e.g., zlib, etc.) for localized compression. Content tagged with an object ID may be processed in accordance with a specific de-duplication algorithm. In one embodiment, the de-duplication algorithm may include dividing incoming content segments into a number of logical blocks in accordance with predefined sequence indicators. For instance, each logical block may include a special predefined sequence (e.g., a newline character in a text file, a hex sequence "0xA5 0xA5" in a binary file, etc.) marking the start/end of a block. A sequence of bytes between such two markers may be identified as a block provided it has a size that falls between predefined acceptable minimum and maximum lengths. Each such block is then hashed with a predefined hashing algorithm to get a fingerprint of the block. Each fingerprint is matched against a hash table that stores the fingerprints of the blocks in the de-duplication history. If a match is found, the container that is pointed toi by the matched hash table entry is retrieved (if not already in the memory) from the persistent storage. If the specific de-duplication mechanism maintains the list of object IDs in the history in a separate list, a second validation can be performed if a matched historical data segment indeed belongs to an identical object that was transmitted in the past. In some implementation, the matching of fingerprints continues for additional confirmation or a better (and bigger) match, even after a match is found.

After a match is found and the container storing the matching historical data is read, the bytes ahead of the matched block within the incoming contents are compared with the data above the matched block of historical data. Similarly the trailing data after the matched blocks is also compared to find a bigger match between the incoming stream and the container retrieved from the history. A lightweight check sum is computed for the matched sequence for the receiving side to confirm the match. If the de-duplication implements location based reference, the matched container ID, the offset and the matched portion along with the checksum is used as reference. On the other hand, if content based reference is used, the hash value of the matched fingerprint, the size and offset of the fingerprinted block within the matched sequence, the size of the matched sequence, and the checksum of the matched sequence are used for reference. A copy of the unmatched data (before, after, and/or in between matched portions) is stored in the history in accordance with a scheme. One such scheme is, if the unmatched portion includes one or more fingerprinted blocks, selecting one or more representative fingerprints from the list. One method of selection is picking the one with largest fingerprint value, or the one with for a block with close to optimum size (say average of minimum and maximum acceptable block sizes). If the incoming data stream is the first segment of a newly identified object, allocate a new chunk, and initialize the chunk header with the newly arrived object ID. If the incoming data is in the midstream of an object and a chunk is already been in used for the object and the chunk is in memory and the chunk has enough free space to store the unmatched portion of the data, the unmatched potion is copied into the chunk at the end of the used space. The selected fingerprint or fingerprints are added into the hash table along with their sizes and the offsets (of the finger printed blocks) within the chunk. If the current allocated chunk does not have enough space, a new chunk is allocated and the filled chunks header is updated with chunk number of the newer one as a link associated with the same object.

When the history reaches a capacity threshold, an algorithm (e.g., least recently used (LRU), etc.) is used to find the oldest unused container of historical data to be discarded. All the hash table entries that point to the freed container are also discarded. If the selected chunk is part of an object that spans multiple containers, all those linked containers are also discarded. After the new file data is stored in history, the unmatched portions of the file data are forwarded along with the references. Depending on how the de-duplication is implemented the reference could be either the location within the container or the hash of the contents. In reality, to facilitate the data travelling in reverse direction, the computed fingerprints are also included in the reference even when the implementation uses absolute location of the data within the history. This way, the receiving side can build its own hash table without actually finding blocks and computing hashes.

Figure 9:
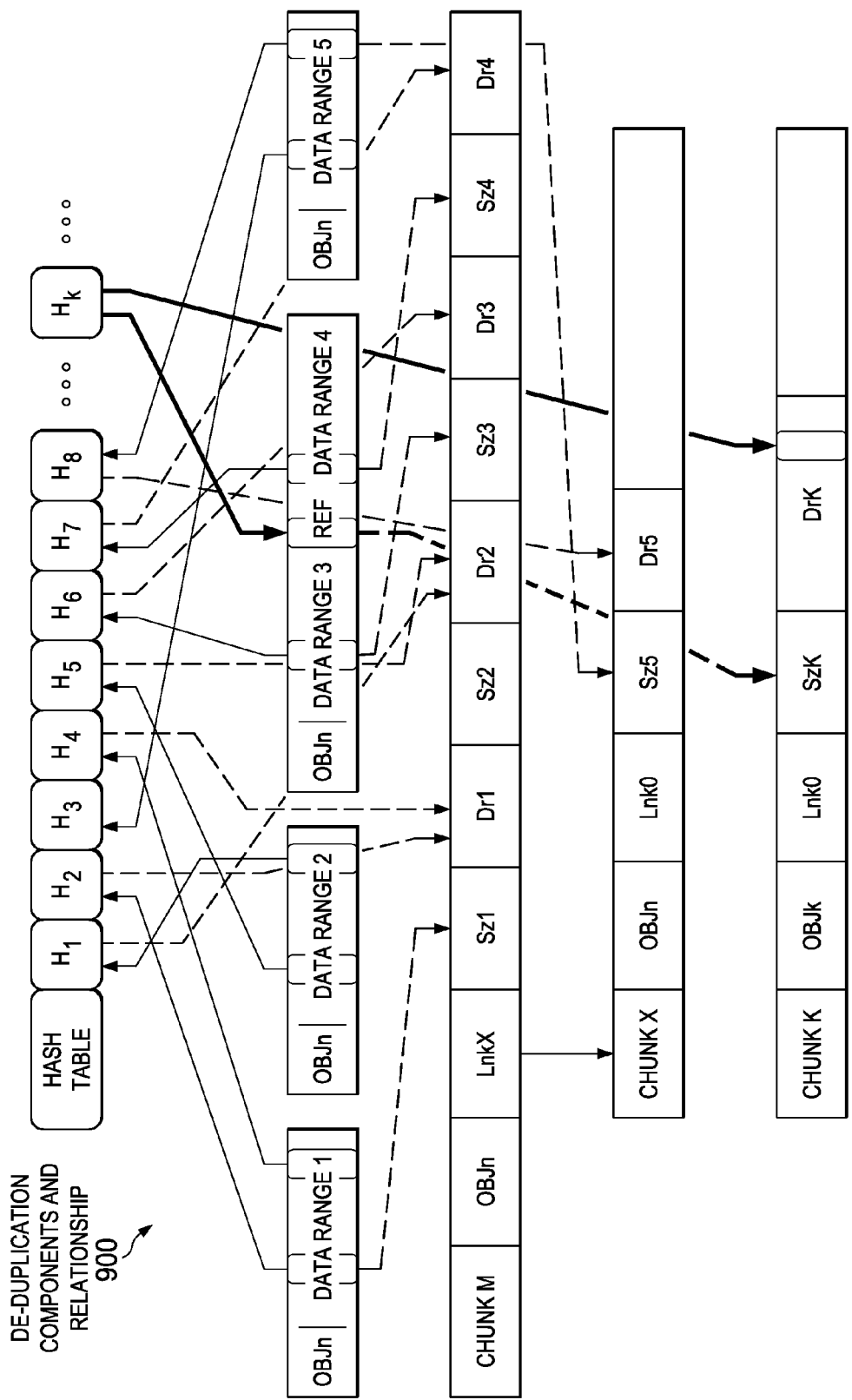
FIG. 9 illustrates a diagram of a relationship between historical data and entries in a hash table.

FIG. 9 depicts a relationship among the hash table, the incoming data stream, and the data layout within the chunks. In this particular diagram, fingerprints of two blocks are shown from each unmatched segments of data. A chunk belonging to an object is shown with the object ID in the chunk header and a place holder for a link to the subsequent chunk for the same object. What is not shown is other header information such as creation and last access time stamp of the chunk. Aside from the header the chunk contains a series of data segments each with a segment-header that contains the size of the segment, and the fingerprints of the blocks within the segments that are present in the hash table.

Figure 10:
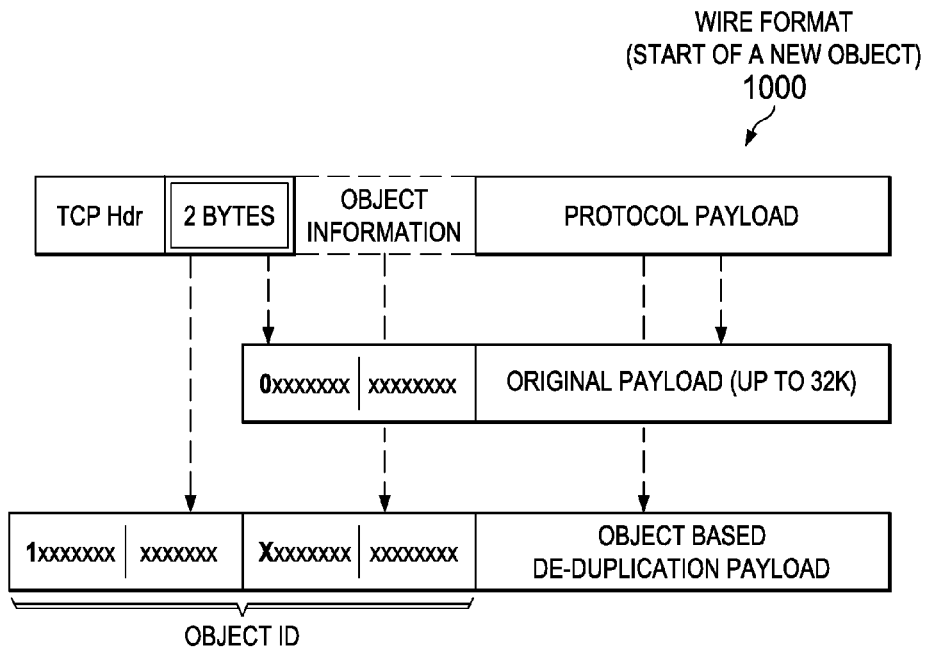
FIG. 10 illustrates an embodiment wire format for forwarding data.

Various wire formats may be used to forward the data from the DPI module to the de-duplication module. FIG. 10 illustrates a wire format 1000 that represents the start of a new object. The two bytes at the beginning identify whether the subsequent bytes are part of an object or an unprocessed stream. If the left most bit of the two bytes is Zero, the two bytes will indicate the size of an unprocessed (no de-dupe related information added) data stream. If the left most bit is 1, then the next two bytes will include in a 4 bytes value representing the Object ID. If all bits of the 4 bytes object ID are 1s, which is a special case, the contents will be expected to include de-dupe information but will not be associated with any objects.

Figure 11:
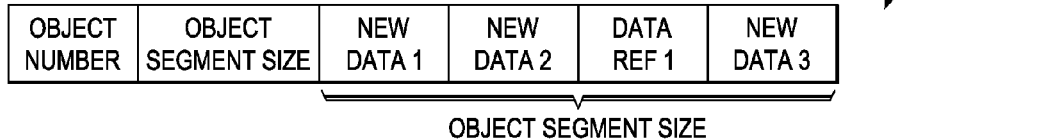
FIG. 11 illustrates another embodiment wire format for forwarding data.
Figure 11:
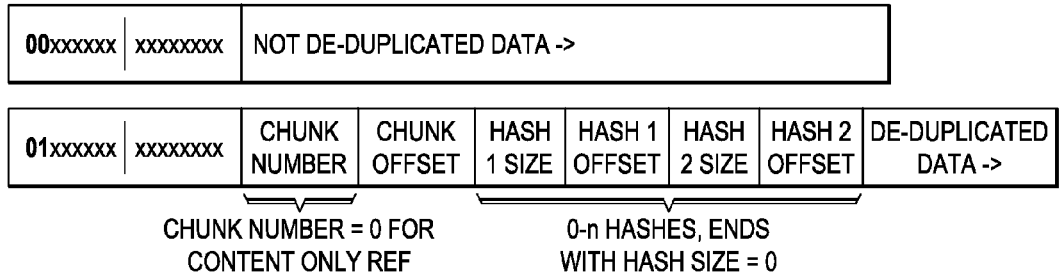
Figure 11:
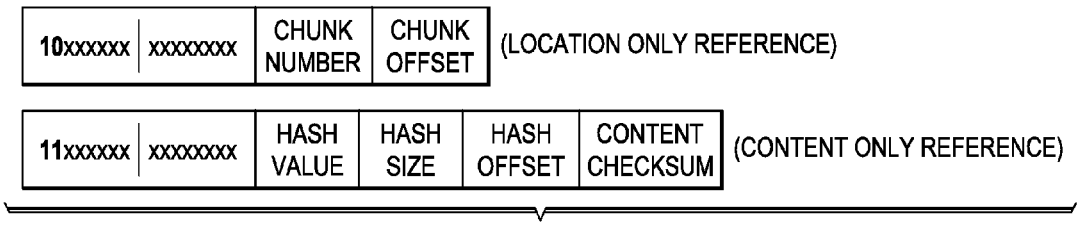

FIG. 11 illustrates a wire format 1100 that represents contents of a stream that are preceded by an object ID. The 4 bytes object ID is immediately followed by 2 bytes indicating the length of succeeding stream segment that is part of the same object but may contain a sequence of unmatched data and matched references. Every matched or unmatched segment in the sequence will be started with 2 bytes that both identify the type and size of the segment. The type of the segment is identified by the leading 2 bits of the first two bytes, while the remaining 14 bits provide the size of the segment. If the leading 2 bits of the two bytes are 00 and 01, then the byte stream will be treated as unmatched data. When leading bits are 00, the content is just unmatched bytes with no reference to chunk or hash blocks what so ever. In practice, a library based compression scheme can be used for such data stream, in that case a separate encoding will be employed, which is beyond the scope of this disclosure). If the leading bits are 01, the unmatched segment will also include the de-dupe references. The de-dupe reference starts with the container number and container offset where the data segment is preserved. If the implementation uses content based reference, the container number is set to zero, and no offset is included. This follows by a series of hash related information. Each hash related information contains two entries, the size and offset of the block whose hash is preserved in the hash table. The value of the hash itself is not needed to be included because the receiver can compute the value from the incoming data stream. The sequence ends with a hash size of zero indicating the end of the series.

The references are indicated by the leading 2 bits of the two bytes set to 10 and 11. The remaining 14 bits provide the size of the matched segment. A value of 10 is used for the bits to provide the location based reference, which simply includes the container number (2 bytes) and offset (2 bytes). When the bits value is 11, the reference is content based, the information provided here is a hash value (4 bytes), hash size (2 bytes), hash offset (2 bytes) within the matched data segment, and the checksum (2 bytes) of the data segment.

Figure 12:
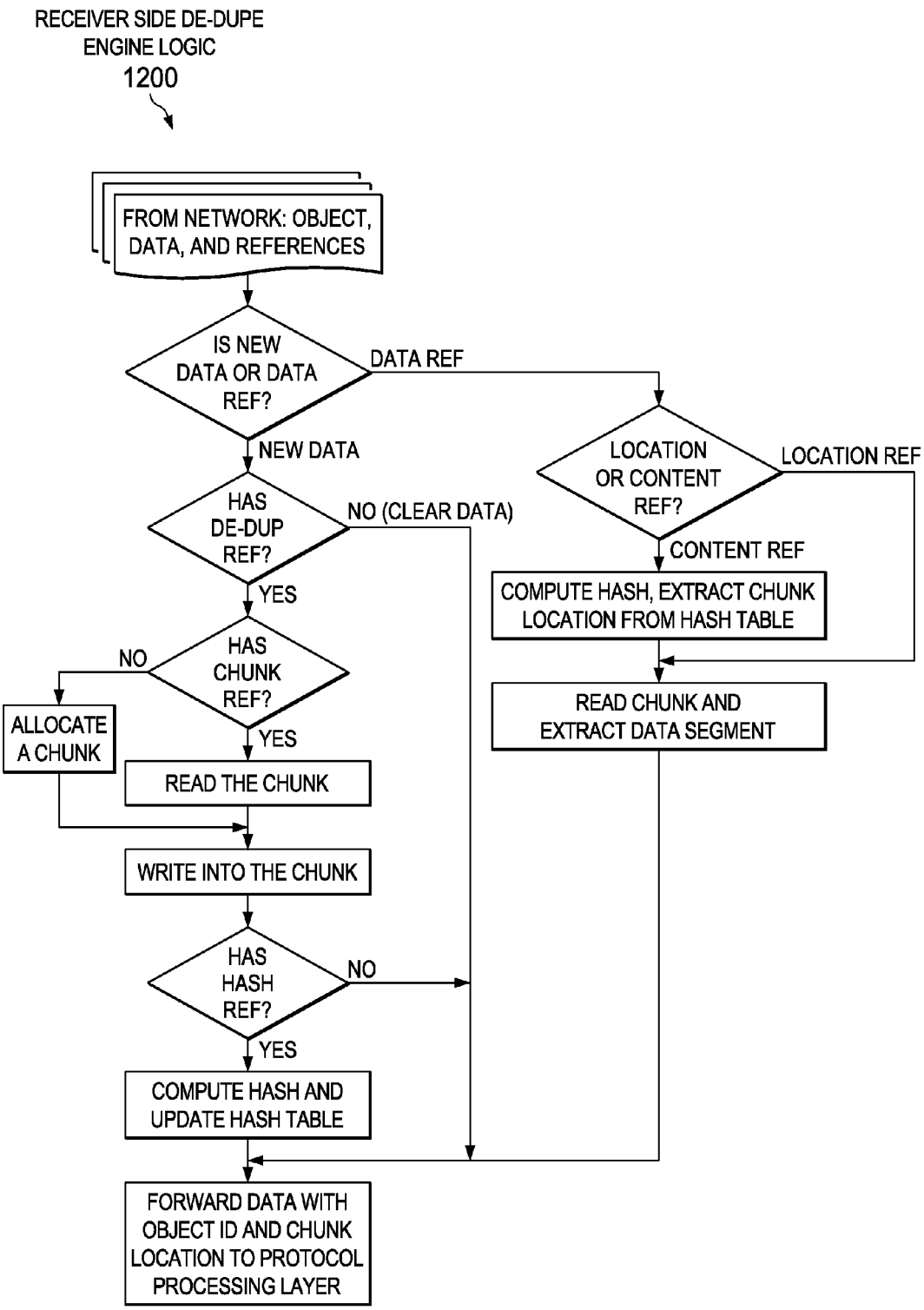
FIG. 12 illustrates a flowchart of a method for receiving de-duplicated data.

FIG. 12 illustrates a method 1200 for receiving data in accordance with aspects of this disclosure. As shown, the method 1200 examines the leading two bytes (e.g., the leading 2 bits of the leading 2 bytes) of every logical segment is determine whether the segment to be processed is part of an object or just a sequence of raw data. If the segment represents part of an object, then the method 1200 further examines the segment to see if it includes de-duplication information such as a reference to a matched segment of historical data. The processing of subsequent bytes may follow logic similar to that which was explained above. If the data segment is a new stream of bytes, the content is added to the history either by using the object information (when the location based reference is used) or computing the fingerprints of the blocks whose location and sizes are provided as reference (when content based reference is used). The data along with the object Id are added to the chunk. On the other hand if the incoming reference is for a matched block, and the chunk information is available in the reference, the container is retrieved into the memory for the matching. For location based reference, the hash value is matched against the hash table and the chunk pointed to by the matched entry is retrieved from the history.

In both sending and receiving side, when an incoming data segment is identified as part of an object and the container retrieved for the matched data includes an object ID and a link to the next container with the same object ID, the linked container is also read in advance to facilitate the matching of the subsequent incoming data stream belonging to the same object.

Figure 13:
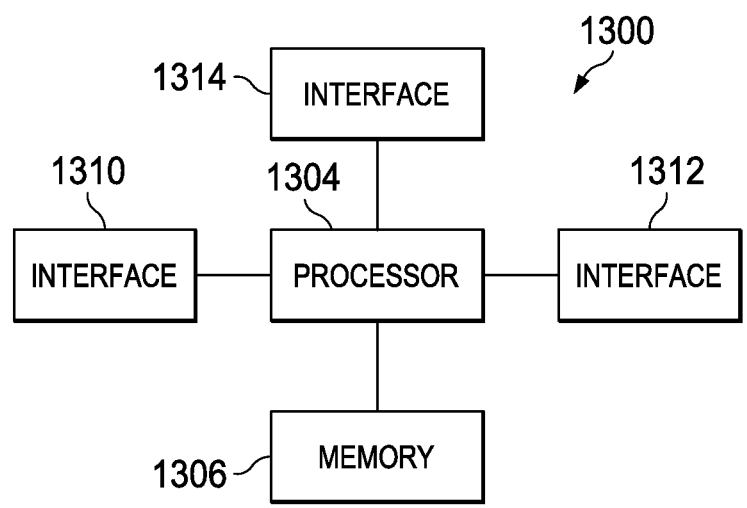
FIG. 13 illustrates a diagram of an embodiment communications device.

FIG. 13 illustrates a block diagram of an embodiment of a communications device 1300, which may be equivalent to one or more devices (e.g., server, client device, LAN device, etc.) discussed above. The communications device 1300 may include a processor 1304, a memory 1306, and a plurality of interfaces 1310-1314, which may (or may not) be arranged as shown in FIG. 13. The processor 1304 may be any component capable of performing computations and/or other processing related tasks, and the memory 1306 may be any component capable of storing programming and/or instructions for the processor 1304. The interfaces 1310-1314 may be any component or collection of components that allow the communications device 1300 to communicate with other devices.

Some aspects of this disclosure have been described as being performed by the DPI module, while other aspects of this disclosure have been described as being performed by the de-duplication module. However, the de-duplication module may be configured to perform some (or all) of the aspects described as being performed by the DPI module, and vice-versa. Further, the DPI module and the de-duplication module may be a common device/module in some implementations.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A method for performing data de-duplication using deep packet inspection, the method comprising:
    receiving file data carried by a data stream;
    partitioning a portion of the file data into a data chunk;
    applying a hash algorithm to data blocks within the data chunk to produce a set of hash values, the set of hash values including at least a first hash value and a second hash value;
    selecting a subset of hash values from the set of hash values to store in a hash table, the subset of selected hash values including fewer than all hash values in the set of hash values, wherein the subset of selected hash values includes the first hash value and excludes the second hash value;
    storing the portion of file data in a container in a history; and
    storing the subset of selected hash values in the hash table without storing non-selected hash values in the hash table, wherein the first hash value is stored in the hash table and the second hash value is excluded from the hash table.

2. The method of claim 1, wherein selecting the subset of hash values from the set of hash values to store in the hash table comprises selecting the first hash value and a third hash value in accordance with a selection criteria.

3. The method of claim 2, wherein the selection criteria dictates selecting the highest hash values produced for a given chunk.

4. The method of claim 1, wherein storing the selected hash values in the hash table comprises:
    storing a pointer reference and one or more offset indicators in an entry of the hash table, wherein the pointer reference identifies a location of the container in the history, and wherein the one or more offset identifiers indicate locations within the container of file data that produced the selected hash values.

5. The method of claim 1, wherein the first hash value corresponds to a first data block in the data chunk without corresponding to a second data block in the data chunk, and the second hash value corresponds to the second data block in the data chunk without corresponding to the first data block in the data chunk.

6. A method for performing data de-duplication using deep packet inspection, the method comprising:
  receiving initial file data carried by a data stream, the initial file data being associated with a common protocol;
  storing, by a de-duplication module, all of the initial file data into a storage location such that all of the initial file data is concentrated into the storage location;
  applying a hash algorithm to individual data blocks within the initial file data to produce at least a first hash value corresponding to a first data block in the initial file data and a second hash value corresponding to a second data block in the initial file data, wherein at least the first hash value is stored in a hash table;
  receiving new file data, wherein hash values are obtained from the new file data;
  matching the first hash value to one of the hash values obtained from the new file data without matching the second hash value to any of the hash values obtained from the new file data;
  reading all of the initial file data from the storage location after matching the first hash value to a hash value obtained from the new file data, the second data block being read without matching the second hash value to any hash value obtained from the new file data; and
  comparing portions of the initial file data with portions of the new file data.

7. The method of claim 6, wherein all of the initial file data is stored in a single container.

8. The method of claim 7, further comprising:
  determining that the history is nearing a threshold capacity; and
  deleting historical data from the history by removing the single container from the history.

9. The method of claim 6, wherein all of the initial file data is stored into multiple linked containers, and wherein storing all of the initial file data into multiple linked containers comprises:
  storing a first portion of the initial file data into a first linked container of the multiple linked containers;
  determining that the first linked container lacks the required capacity to store remaining portions in the initial file data; and
  storing at least some of the remaining portions of the initial file data in a second linked container in the multiple linked containers.

10. The method of claim 9, further comprising: preloading the second linked container upon comparing new file data to historical data in the first linked container.

11. A method for performing data de-duplication using deep packet inspection, the method comprising:
  receiving file data carried by a data stream, the file data being associated with a common protocol;
  partitioning a portion of the file data into a data chunk;
  applying a hash algorithm to blocks within the data chunk to produce hash values;
  matching at least some of the hash values to an entry in a hash table, the entry including a pointer indicating a segment of historical data stored in a container in a history;
  reading all historical data from the container in the history without matching hash values to remaining segments of historical data in the container;
  determining that the data chunk matches a segment of historical data from the container; and
  comparing remaining portions of the file data with the remaining segments of historical data from the container.

12. The method of claim 11, wherein comparing the remaining portions of the file data with the remaining segments of historical data from the container comprises:
  comparing the remaining portions of the file data with remaining segments of historical data from the container without applying the hash algorithm to the remaining portions of the file data.

13. The method of claim 11, wherein comparing the remaining portions of the file data with the remaining segments of historical data from the container comprises:
  comparing the remaining portions of the file data with the remaining segments of historical data from the container without partitioning the remaining portions of the file data into separate chunks.

14. The method of claim 11 further comprising:
  determining that the file data matches the historical data from the container;
  replacing the file data with a reference indicator to obtain a de-duplicated data stream; and
  transmitting the de-duplicated data stream over a network.

15. The method of claim 11, wherein the remaining segments of historical data are related to the segment of the historical data that was matched to the data chunk.

16. The method of claim 11, wherein determining that the data chunk matches the segment of historical data comprises:
  aligning the data chunk with the segment of historical data; and
  comparing the aligned data chunk and segment of historical data bit-by-bit.

17. The method of claim 16, wherein aligning the data chunk with the segment of historical data comprises:
  identifying one or more blocks of the data chunk that produced the matching hash values;
  identifying blocks of historical data in the segment of historical data in accordance with offset indicators; and
  lining up the identified blocks of the data chunk with the identified blocks of the historical data.

18. An apparatus for performing data de-duplication using deep packet inspection, the apparatus comprising:
  a processor; and
  a computer readable storage medium storing programming for execution by the processor, the programming including instructions to:
    receive file data carried by a data stream;
    partition a portion of the file data into a data chunk;
    apply a hash algorithm to data blocks within the data chunk to produce a set of hash values, the set of hash values including at least a first hash value and a second hash value;
    select a subset of hash values from the set of hash values to store in a hash table, the subset of selected hash values including fewer than all hash values in the set of hash values, wherein the subset of selected hash values includes the first hash value and excludes the second hash value;
    store the portion of file data in a container in a history; and
    store the subset of selected hash values in an entry of the hash table without storing non-selected hash values in the hash table, wherein the first hash value is stored in the hash table and the second hash value is excluded from the hash table.

19. The apparatus of claim 18, wherein the first hash value corresponds to a first data block in the data chunk without corresponding to a second data block in the data chunk, and the second hash value corresponds to the second data block in the data chunk without corresponding to the first data block in the data chunk.

20. An apparatus comprising:
   a processor; and
   a computer readable storage medium storing programming for execution by the processor, the programming including instructions to:
      receive initial file data carried by a data stream, the initial file data being associated with a common protocol;
      store, by a de-duplication module, all of the initial file data into a storage location such that all of the initial file data is concentrated into the storage location;
      apply a hash algorithm to individual data blocks within the initial file data to produce at least a first hash value corresponding to a first data block in the initial file data and a second hash value corresponding to a second data block in the initial file data, wherein at least the first hash value is stored in a hash table;
      receive new file data, wherein hash values are obtained from the new file data;
      match the first hash value to one of the hash values obtained from the new file data without matching the second hash value to any of the hash values obtained from the new file data;
      read all of the initial file data from the storage location after matching the first hash value to a hash value obtained from the new file data, the second data block being read without matching the second hash value to any hash value obtained from the new file data; and
      compare portions of the initial file data with portions of the new file data.

21. The apparatus of claim 20, wherein the object ID is offset in the data stream.

22. The apparatus of claim 21, wherein the instructions to apply the de-duplication algorithm to the file data include instructions to:
   remove the file data from the data stream;
   apply a hashing algorithm to the file data to generate hash values;
   store the file data in a history; and
   store fewer than all of the hash values in a hash table.

23. The apparatus of claim 22, wherein the instructions to remove the file data from the data stream include instructions to:
   strip transport control protocol (TPC) headers off of packets transported in the data stream, thereby obtaining a contiguous string of payloads;
   locate a leading network file system (NFS) header and a trailing NFS header in the contiguous string of payloads; and
   place payload data located in-between leading NFS header and the trailing NFS header into an object.

* * * * *